United States Patent [19]

Hanson

[11] 4,011,515
[45] Mar. 8, 1977

[54] TUNABLE SCANNING RADIO RECEIVER

[75] Inventor: Raymond F. Hanson, Whitesboro, N.Y.

[73] Assignee: General Electric Company, Syracuse, N.Y.

[22] Filed: May 23, 1975

[21] Appl. No.: 580,269

[52] U.S. Cl. ............................ 325/470; 325/465
[51] Int. Cl.² .................................... H04B 1/32
[58] Field of Search .......... 325/470, 465, 335, 453, 325/468, 469; 334/11, 14, 15

[56] References Cited

UNITED STATES PATENTS

| | | | |
|---|---|---|---|
| 3,497,813 | 2/1970 | Gallagher | 325/456 |
| 3,571,724 | 3/1971 | Borg | 325/470 |
| 3,654,557 | 4/1972 | Sakamoto | 325/465 |

Primary Examiner—Robert L. Griffin
Assistant Examiner—Marc E. Bookbinder
Attorney, Agent, or Firm—Marvin A. Goldenberg

[57] ABSTRACT

A scanning radio receiver that is electronically tuned for station selectivity over a given band of frequencies. Varactor diodes contained in the RF and local oscillator stages of the scanning receiver circuitry are voltage controlled to select a finite number of different station frequencies within said given frequency band. A scan control circuit composed of several sections each including a potentiometer applies discrete d.c. voltages corresponding to the selected station frequencies to said varactor diodes. Digital means are employed to sequentially actuate the scan control circuit sections under the control of a received signal.

7 Claims, 2 Drawing Figures ns of quartz crystals sequentially connected into the local oscillator circuit for changing the local oscillator frequency and, correspondingly, providing scan tuning of the receiver in accordance with whatever valued crystals are employed. Crystals are relatively expensive and, therefore, most scanning receivers presently sold are high cost items. There is a further disadvantage in the requirement that a particular frequency crystal be obtained for each station to be scan, since there are thousands of stations in the public service band of 148 to 176 MHz each requiring a different crystal.

Another scanning radio receiver employs a crystal controlled oscillator with a single crystal, wherein multiple local oscillator frequencies are generated by means of rather complex logic circuitry. This type of receiver is also costly.

SUMMARY

A principal object of the present invention, therefore, is to provide a novel scanning radio receiver that is of simplified circuitry and can be economically constructed.

A further object of the invention is to provide a scanning radio receiver that can be readily adjusted to any desired group of stations within a given frequency band.

Yet another object of the invention is to provide a scanning radio receiver that employs continuously variable tuning means within the receiver tuning section to arrive at the selected station frequencies.

These and other objects of the invention are accomplished, in accordance with one exemplary embodiment of the invention, in a tunable scanning radio receiver that comprises varactor diode circuitry within the tuning section of the receiver and a scan control means for generating a sequence of discrete control voltages that are applied to the varactor diodes for adjusting tuning of the receiver in accordance with said voltages. Digital means responsive to the received signal strength operating the scan control means to step its output voltage through a predetermined sequence of values each corresponding to a given station frequency desired to be tuned, said operation being interrupted upon the received signal strength exceeding a given value.

BRIEF DESCRIPTION OF THE DRAWING

The invention may be further understood by considering the following description in connection with the drawings, wherein.

DESCRIPTION OF THE PREFERRED EMBODIMENT

Figure 1:
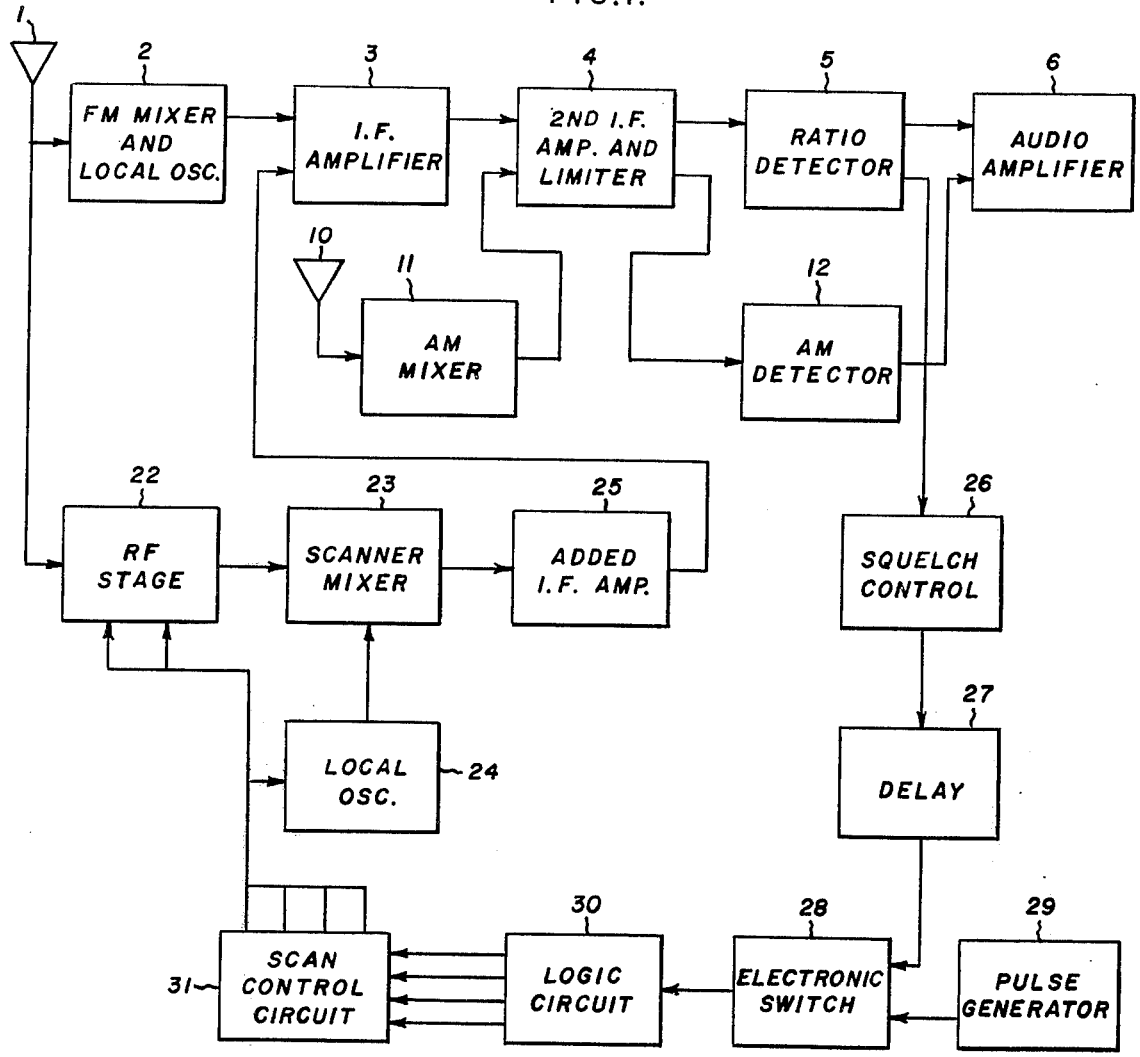
FIG. 1 is a block diagram of preferred embodiment of a tunable scanning receiver, which in addition to the novel scanning circuitry also includes circuitry for receiving regular AM and FM broadcasts.

In FIG. 1, there is illustrated a block diagram of a tunable scanning radio receiver which, in addition to a novel scanning circuit, includes components for providing AM and FM radio broadcast reception. Considering first those components providing reception of FM broadcasts, there is illustrated an antenna 1 coupled to an FM mixer and local oscillator component 2, the output of which is coupled to an IF amplifier and filter stage composed of an IF amplifier network 3 and a second IF amplifier and limiter network 4. The output of network 4 is connected to a ratio detector 5 and thence coupled to an audio amplifier 6, from which the output audio signal is obtained. Each of the recited FM receiver components contain conventional circuitry and neither their circuitry nor operation, therefore, need be considered in detail.

With respect to the reception of AM broadcasts, there is provided an AM antenna 10 coupled to a AM autodyne mixer 11, the output of which is applied to the IF amplifier and limiter component 4, the limiter action of this portion of the circuit not being effective during AM reception. A second output from network 4 is coupled to an AM detector 12, and its output applied to the audio amplifier 6. The AM mixer 11 and AM detector 12 are also conventional circuit components and will not be described in detail.

With respect to the scanning circuitry, circuit components are employed which provide a tunable scan over a particular band of frequencies, such as the public service band of 148 to 176 MHz. Stations selected for scanning are manually tuned over a continuous range of frequencies within the indicated frequency band, as contrasted with crystal scan receivers wherein discrete frequencies are selected through insertion into the circuit of different crystals. The circuit includes an RF amplifier and filter stage 22 which receives its input from the antenna 1. During scan tuning, the antenna 1 supplies signal to the scanning circuitry and AM and FM broadcast reception is made inoperative by a conventional switching action.

Figure 2:
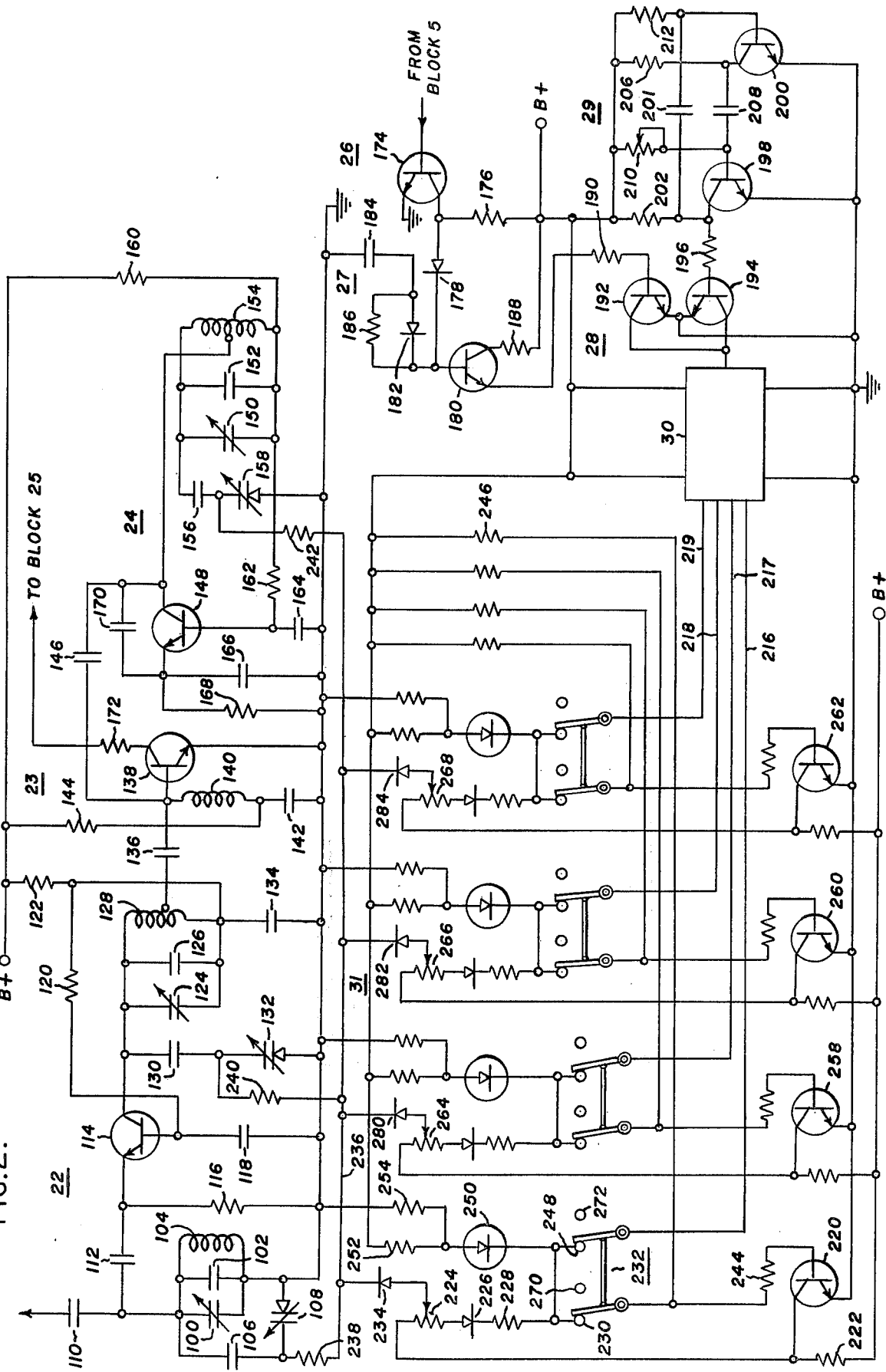
FIG. 2 is a schematic circuit diagram of the novel scanning circuit of FIG. 1.

The RF stage 22 includes a pair of tuning components in the form of varactor diodes, more fully described when considering the schematic circuit diagram of FIG. 2, which tune the RF stage to the input signal in accordance with the scan tuning operation. The output of the RF stage 22 is applied to a scanner mixer 23, as is a signal from local oscillator circuit 24, which also includes a varactor diode tuning component. The scanner mixer converts the RF signal into an IF signal, nominally at 10.7 MHz. The output of the scanner mixer is coupled to an added IF amplifier and filter stage 25 which has its output connected to the IF amplifier component 3. The added IF amplifier and filter network 25 is a conventional component for providing a more highly selective IF filter characteristic for the signal being processed through the scan receiver circuitry, reducing the IF bandwidth from about 200 KHz to about 75 KHz, measured at the 6 db attenuation points.

The received scanning signal is coupled from the IF amplifier 3 through the second IF amplifier stage 4, ratio detector 5 and audio amplifier 6 to provide an output in the same fashion as for the FM broadcast signal. In addition, however, there is provided a second output from the ratio detector applied to a squelch control network 26, the output of which is connected to a delay network 27 and to an electronic switch 28. The switch 28 also receives the output from a pulse generator 29 for controlling the application of pulses to a logic circuit 30. The output of the logic circuit 30 sequentially actuates a scan control circuit 31, which circuit generates a sequence of discrete control voltages that are applied to the varactor diode tuning elements of the RF stage 22 and local oscillator 24.

With respect to the operation of the scanning radio receiver on FIG. 1, an appropriate switch is provided for determining the mode of operation of the receiver, this switch being a conventional component and not shown in drawing. In the event of AM or FM broadcast reception, only those circuit components necessary for the selected reception are connected into the circuit and the receiver operates in a known manner. For a scan receive operation, the received signal is applied to the RF stage 22. Tuning of this stage and that of local oscillator 24 is determined by discrete control voltages applied from the scan control circuit 31 which is made to step through a sequence of such control voltages under the control of the logic circuit 30. A selected received signal is thus converted to the IF frequency and passed through the IF amplifier and filter circuits and detected in the ratio detector 5. A d.c. output of the detector is applied to the squelch control network 26 for sensing the signal strength of the selected received signal. If the signal strength is below an established threshold level, the squelch control network provides a signal through the delay network for enabling the switch 28 and allowing pulses from pulse generator 29 to actuate the logic circuit 30. The outputs of logic circuit 30 in turn cause the scan control circuit to step through its sequence of control voltages to a value corresponding to the next selected station frequency. This process will continue and the RF stage 22 and local oscillator 24 will be sequentially tuned through a sequence of station frequencies within a given frequency band until a station is selected having a signal strength that exceeds the established threshold level. When this occurs, the output of squelch control network 26 applied to switch 28 decouples the output of the pulse generator 29 from the logic circuit 30, thereby interrupting the scan operation of circuit 31 and maintaining tuning of the receiver to the signal then being received.

Should reception on this channel be temporarily interrupted due to loss or impairment of the received signal, where the signal strength may momentarily fall below established threshhold level, the delay network 27 maintains the switch 28 in its "off" state so as to hold tuning until the received signal strength returns to its normal level. When loss of signal is relatively permanent, i.e., the signal strength remains below the established threshold level, the delay network becomes ineffective and the output of the squelch control network turns the switch "on" and couples pulses from the pulse generator 29 to the logic circuit to resume stepping of the scan control circuit 31. When another selected channel is received whose signal strength exceeds the established threshold level, the switch 28 once again decouples the pulses from pulse generator 29 for disabling the logic circuit 30 and interrupting the scan operation so as to maintain tuning at the newly received signal frequency.

Referring to the schematic circuit diagram of FIG. 2 showing circuit details of the scan tuning components of the receiver, the RF stage 22 includes an input tuned circuit comprising a variable capacitor 100, fixed capacitor 102 and inductor 104 connected in parallel with a serially connected d.c. blocking capacitor 106 and a first variactor diode 108. The upper junction of the input tuning circuit is connected through a coupling capacitor 110 to the antenna and through a coupling capacitor 112 to the emitter electrode of an NPN transistor 114. The lower junction of the input tuning network is connected to ground. The emitter of transistor 114 is also connected to ground through a resistor 116, the base connected to ground through an a.c. bypass capacitor 118 and through serially connected Bias resistors 120 and 122 to a source of B+ potential. The collector electrode of transistor 114 is connected to the upper terminal of an output tuning circuit including a variable capacitor 124, fixed capacitor 126 and inductor 128 connected in parallel with the series connection of a d.c. blocking capacitor 130 and a second varactor diode 132. The lower junction of capacitors 124, 126 and inductor 128 is connected through an a.c. bypass capacitor 134 to ground and also to the junction of resistors 120 and 122.

The output of the RF stage 22 is taken from a tap on coil 128 and coupled through a coupling capacitor 136 to the base of an NPN transistor 138 of the scanner mixer stage 23, the base being connected to ground through serially connected inductor 140 and capacitor 142. The junction of coil 140 and capacitor 142 is connected through a bias resistor 144 to source B+. The base of transistor 138 is further connected through a coupling capacitor 146 to the collector of the NPN transistor 148 in the local oscillator circuit 24. The collector of transistor 148 is further connected to a tuned circuit including the parallel connection of a variable capacitor 150, fixed capacitor 152 and a coil 154, and connection from the collector to the tuned circuit being made to a tap on the coil 154. The lower junction of the tuned circuit is connected through a resistor 160 to source B+ and through a further resistor 162 in series with an a.c. bypass capacitor 164 to ground, the base of transistor 148 being connected to the junction of resistor 162 and capacitor 164. Also part of the local oscillator tuned circuit is the serial combination of a capacitor 156 and a third varactor diode 158 connected between the upper junction of the tuned circuit and ground. The emitter of transistor 148 is connected through the parallel connection of a voltage dividing capacitor 166 and a resistor 168 to ground and through a coupling capacitor 170 to the collector electrode.

The mixer circuit in response to a selected RF signal tuned by the varactor diodes 108 and 132 and the local oscillator signal tuned by the varactor diode 158, provides an IF signal at the collector electrode of transistor 138, which is connected through a resistor 172 to block 25.

The squelch control circuit 26 includes an NPN transistor 174, the emitter of which is connected to ground and the collector connected through a load resistor 176 to source B+. Its input to the base electrode is applied from the ratio detector 5. The collector provides the output from the squelch control circuit and is further connected to the delay circuit 27 which includes a first diode 178 poled to conduct current from the collector of transistor 174 and connected to the base of a series regulator NPN transistor 180. The base of this transistor is also being connected through a second diode 182 and in series with a capacitor 184 to ground, a resistor 186 connected in shunt with diode 182. The diode 182 is poled so as to conduct current into the base of transistor 180. The collector of transistor 180 is connected through a current limiting resistor 188 to source B+, and the emitter electrode is connected through a resistor 190 to the base of a first transistor 192 of the switching network 28. The emitter of transistor 192 is connected to the emitter of a second transistor 194, and the junction thereof connected to ground. The base of transistor 194 is connected through a resistor 196 to the output of pulse generator network 29.

The pulse generator network is a flip flop circuit which includes a first NPN transistor 198 and a second NPN transistor 200, the emitter electrodes of which are joined at ground. The collector electrode of transistor 198 is connected through a load resistor 202 to source B+ and through a coupling capacitor 201 to the base of transistor 200. The collector of transistor 200 is connected through a load resistor 206 to source B+ and through a coupling capacitor 208 to the base of transistor 198. The base of transistor 198 is further connected through a variable bias resistor 210 to source B+, and the base of transistor 200 is further connected through bias resistor 212 to source B+. The network 28 generates a constant succession of pulses nominally at a 20 Hz rate which are applied to the base of switch transistor 194. The collectors of transistors 192 and 194 are joined together and connected to the input of logic circuit 30 which has four output connections. Logic circuit 30 provides a shift register operation and may be comprised of a pair of IC circuits, the first a standard IC clock circuit and the second a standard IC nand gate, which when connected in a prescribed fashion provide the desired shift register operation. In one operable embodiment, a 74L74 IC and a 74L03 IC were employed as the clock circuit and nand gate, respectively.

The scan control circuit 31 comprises four scan control sections. The first section includes an NPN transistor 220, the emitter of which is connected to ground and the collector connected through a load resistor 222 to source B+. The collector is further connected through the series connection of a potentiometer 224, a diode 226 and a resistor 228 to one terminal 230 of a priority switch 232, which is a manually operated double pole, double throw switch. Diode 226 is poled to conduct current towards the switch terminal 230. A tap on the potentiometer 24 is connected through a diode 234 to an output conductor 236 which supplies the scan control circuit output voltage to the three varactor diodes in the RF stage 22 and local oscillator stage 24. This voltage is connected through resistor 238 to the varactor diode 108 to control its capacitance, and is similarly connected through resistors 240 and 242 to varactor diodes 132 and 158, respectively for controlling the capacitance of these diodes. Diode 234 is poled to conduct current towards the varactor diodes. With switch 232 in the operable position, as shown in FIG. 2, one side of the movable contact, which contacts terminal 230, is connected through a bias resistor 244 to the base of NPN transistor 220 and is further connected through a bias resistor 246 to source B+. The other side of the movable contact makes connection with a second terminal 248, which terminal is connected through a light emitting diode 250 in series with a load resistor 252 to source B+. Light emitting diode 250 is also connected in series with a further resistor 254 to ground. The side of the movable contact that connects with terminal 248 is coupled to a first output 216 of the logic circuit 30.

The remaining scan control circuit sections which are under the control of outputs 217, 218 and 219 of logic circuit 30 and include, respectively, NPN transistors 258, 260 and 262, potentiometers 264, 266 and 268 are constructed similarly to the first section and their circuitry will not be further described.

In the operation of the circuit of FIG. 2, selected frequencies within a given band frequencies are obtained by manual adjustment of potentiometer 224 of the first scan control section of scan control circuit 31, as well as potentiometers 264, 266 and 268 of the remaining scan control sections. Thus, at any one given time, a group of four different stations may be scanned. The priority switches, such as switch 232 of the first scan control section, are normally in the operable position as shown, which causes each of the selected frequencies to be scanned. However, by manually positioning the switch in the inoperable position so as to engage the open circuit terminals, such as 270 and 272 of the first scan control section, one or more of the scan control sections may be bypassed, as will be and the station frequencies associated therewith.

The scan control sections are actuated by means of the output signals from the logic circuit 30, this circuit providing a sequential ground connection at each of its outputs 216, 217, 218 and 219, which ground connection is stepped from one output to the next under the control of the pulses applied to the input. If for a given point in time it is assumed that the output connection 216 is at ground, the other output connections 217, 218 and 219 would be open circuited and only the first scan section actuated. Thus, the base of transistor 220 is at ground which prevents the transistor from conducting and the circuit for B+ is completed through resistor 222, the potentiometer 224, diode 226, resistor 228 through terminal 230 and switch 232 to ground. Accordingly, the tapped voltage from potentiometer 224 is connected through diode 234 to varactor diodes 108, 132 and 158 for determining the capacitance of these diodes and therefore the frequency to which the circuit is tuned.

The remaining scan control sections are inoperative at this time due to conduction of the transistors 258, 260 and 262 removes the voltage from across the potentiometers in these sections. Furthermore, for this conduction, diodes 280, 282 and 284 of the inoperative sections are back biased and prevent the voltage on conductor 236 from interacting with the remainder of the circuit.

If in the operation of a circuit of FIG. 2 it is assumed that the station selected by actuating the first scan control section has a signal strength exceeding the threshold level established by the squelch control circuit 26, transistor 174 is made nonconducting and the voltage at its collector electrode is connected to the base of the delay circuit transistor 180 for turning this transistor "on". This applies a voltage to the base of transistor 192 which turns this transistor "on" and effectively grounds the input to logic circuit 30. The voltage applied to the base of transistor 180 also acts to charge capacitor 184 so that should the signal be temporarily lost, the voltage across capacitor 184 will maintain transistor 180 in its conducting state. So long as a signal is received that is of adequate signal strength the receiver will remain tuned to this signal.

Upon the received signal falling below the established threshold level, transistor 174 of the squelch control circuit conducts which substantially lowers the voltage at its collector so that the transistor 180 becomes nonconducting. The pulses generated by pulse generator 29 are then applied through transistor 194 to the input of logic circuit 30 to cause this circuit to continue its stepping operation whereby a sequence of outputs is generated. Thus, in the next sequence of operation the second output 217 is at ground, which is applied to the base of transistors 258 for causing this transistor to become nonconductive and apply a voltage to potentiometer 264. Transistor 220 now conducts so as to remove the potential formerly applied to potentiometer 224. For this sequence of operation the tapped voltage across potentiometer 264 is coupled through diode 280 to the varactor diodes 108, 132 and 158 for tuning to a frequency corresponding to the applied voltage. If the received signal strength at this tuned frequency should be inadequate, the logic circuit will continue its sequencing operation and in the next time sequence the third output 218 will provide the ground connection for actuating the third scan control section and a third frequency will be tuned as a function of the voltage supplied by the tapped potentiometer 266. Tuning will remain at this frequency if the receives signal strength is sufficient, or otherwise continue to the next tuned frequency until an adequate signal is received.

Although the invention has been presented in accordance with one specific exemplary embodiment, the following claims are intended to include within their meaning all modifications and alternatives that fall within the true scope and spirit of the invention.

What we claim as new and desire to secure by Letters Patent of the United States is:

1. A scanning radio receiver for automatically scanning a number of selected station frequencies within a given frequency band, comprising:
   a. at least one voltage sensitive tunable element connected in the receiver circuit for tuning the receiver to said station frequencies as a function of a control voltage applied thereto,
   b. scan control means for generating a plurality of discrete control voltages,
   c. said scan control means including adjustable means for providing manual adjustment of said discrete control voltages over a range of values,
   d. digital means for sequentially actuating said scan control means so as to provide at the output thereof an ordered sequence of said discrete control voltages,
   e. first means for applying the output of said scan control means to said tunable element, and
   f. second means for controlling said digital means as a function of the received signal so as to operate said digital means for providing scan tuning of said selected station frequencies when the received signal does not exceed a minimum signal strength and to inhibit operation of said digital means for interrupting said scan tuning when the received signal does exceed said minimum signal strength.

2. A scanning radio receiver as in claim 1 wherein said scan control means includes a plurality of scan control sections, each section comprising:
   a. a voltage source,
   b. a potentiometer with an adjustable tap from which said discrete voltages are derived, and
   c. third means for applying said voltage source to said potentiometer in response to an output from said digital means.

3. A scanning radio receiver as in claim 2 wherein said digital means has a plurality of outputs whose states change in accordance with a shift register operation during operation of said digital means, said plurality of outputs being individually connected to a respective one of said scan control sections for controlling the operation of said third means, whereby at any one time only one of said third means acts to apply its associated voltage source to its associated potentiometer.

4. A scanning radio receiver as in claim 3 wherein said third means comprises a transistor connected with its associated voltage source and potentiometer so that when said transistor conducts the voltage source is effectively decoupled from the potentiometer and when said transistor is nonconducting the voltage source is applied to the potentiometer.

5. A scanning radio receiver as in claim 4 wherein said second means comprises a pulse generator coupled to said digital means through an electronic switch, and fourth means for controlling the operation of said switch in response to the detected signal, said switch acting to decouple the pulse generator from the digital means in the presence of a detected signal resulting from a received signal exceeding said minimum signal strength.

6. A scanning radio receiver as in claim 5 wherein said fourth means comprises delay means for maintaining decoupling of said pulse generator from said digital means during temporary interruptions of the received signal.

7. A scanning radio receiver as in claim 6 wherein said voltage sensitive tunable element is a varactor diode.

* * * * *